US012658577B2

(12) United States Patent (10) Patent No.: US 12,658,577 B2

Li (45) Date of Patent: Jun. 16, 2026

(54) PHASED ARRAY APPARATUS AND COMMUNICATION DEVICE

(71) Applicant: HUAWEI TECHNOLOGIES CO., LTD., Shenzhen (CN)

(72) Inventor: Zhi Li, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 329 days.

(21) Appl. No.: 18/472,024

(22) Filed: Sep. 21, 2023

(65) Prior Publication Data

US 2024/0014554 A1 Jan. 11, 2024

Related U.S. Application Data

(63) Continuation of application No. PCT/CN2021/082840, filed on Mar. 24, 2021.

(51) Int. Cl.
*H01Q 3/42* (2006.01)
*H03F 1/56* (2006.01)
*H04B 1/18* (2006.01)

(52) U.S. Cl.
CPC ................. *H01Q 3/42* (2013.01); *H03F 1/56* (2013.01); *H04B 1/18* (2013.01)

(58) Field of Classification Search
CPC ... H01Q 3/42; H01Q 3/36; H03F 1/56; H04B 1/18; H04B 1/40; H03D 7/1441; H03D 7/1458; H03D 7/165
See application file for complete search history.

(56) References Cited

U.S. PATENT DOCUMENTS 7,760,833 B1 7/2010 Brunner
9,667,235 B1 5/2017 Wyse et al.
(Continued)

FOREIGN PATENT DOCUMENTS

CN 102474221 A 5/2012
CN 108152798 A 6/2018

OTHER PUBLICATIONS

International Search Report and Written Opinion in International Appln. No. PCT/CN2021/082840, mailed on Sep. 28, 2021, 17 pages (with English translation).

(Continued)

*Primary Examiner* — Renan Luque
(74) *Attorney, Agent, or Firm* — Fish & Richardson P.C.

(57) ABSTRACT

This application provides example phased array apparatuses and example communication devices. One example apparatus includes: an antenna array including a antenna elements; a plurality of receiving channels, coupled to the antenna elements in the antenna array, where each of the plurality of receiving channels includes a transconductance stage circuit, the transconductance stage circuit includes a first transconductance unit array and a second transconductance unit array; a quadrature frequency-mixing circuit, where a non-inverting input end and a quadrature input end of the quadrature frequency-mixing circuit are respectively coupled to an output end of the first transconductance unit array in the plurality of receiving channels and an output end of the second transconductance unit array in the plurality of receiving channels; and a signal processing circuit, where an input end of the signal processing circuit is coupled to an output end of the quadrature frequency-mixing circuit.

18 Claims, 8 Drawing Sheets

(56) References Cited

U.S. PATENT DOCUMENTS

| | | | | |
|---|---|---|---|---|
| 2011/0001539 A1* | 1/2011 | Choksi | .................. | H03D 7/165 |
| | | | | 327/355 |
| 2011/0227649 A1 | 9/2011 | Montalvo | | |
| 2013/0337757 A1* | 12/2013 | Szortyka | ............... | H04B 7/084 |
| | | | | 455/233.1 |
| 2019/0007003 A1* | 1/2019 | Sivonen | ................. | H03F 3/195 |

OTHER PUBLICATIONS

Szortyka et al., "A Wideband Beamforming Lowpass Filter for 60 GHz Phased-Array Receivers," IEEE Transactions on Circuits and Systems—I: Regular Papers, vol. 62, No. 9, Sep. 1, 2015, pp. 2324-2333.
Extended European Search Report in European Appln. No. 21932156.9, mailed on Mar. 6, 2024, 8 pages.

* cited by examiner

PHASED ARRAY APPARATUS AND COMMUNICATION DEVICE

CROSS-REFERENCE TO RELATED APPLICATIONS

This application is a continuation of International Application No. PCT/CN2021/082840, filed on Mar. 24, 2021, the disclosure of which is hereby incorporated by reference in its entirety.

TECHNICAL FIELD

This application relates to the field of communication technologies, and in particular, to a phased array apparatus and a communication device.

BACKGROUND

A phased array technology is widely used in fields including 5G communication, microwave backhaul, indoor short-range communication, and the like.

In a solution in a conventional technology, a phased array may include a plurality of channels, and each of the plurality of channels includes a plurality of passive components. Consequently, an area of the phased array is large. In this case, how to reduce the area of the phased array to further reduce a size of a communication device to which the phased array is applied is an urgent technical problem to be resolved.

SUMMARY

This application provides a phased array apparatus and a communication device, to reduce an area of a phased array.

To achieve the foregoing objective, the following technical solutions are used in this application.

According to a first aspect, a phased array apparatus is provided, and the apparatus includes: a plurality of receiving channels, coupled to a plurality of antenna elements in an antenna array, where each of the plurality of receiving channels includes a transconductance stage circuit, the transconductance stage circuit includes a first transconductance unit array and a second transconductance unit array, and an input end of the first transconductance unit array and an input end of the second transconductance unit array in each receiving channel are coupled to an antenna element corresponding to the receiving channel; a quadrature frequency-mixing circuit, where a non-inverting input end and a quadrature input end of the quadrature frequency-mixing circuit are respectively coupled to an output end of the first transconductance unit array in the plurality of receiving channels and an output end of the second transconductance unit array in the plurality of receiving channels; and a signal processing circuit, where an input end of the signal processing circuit is coupled to an output end of the quadrature frequency-mixing circuit, to perform amplification, filtering, and the like on coupled currents that are of the plurality of receiving channels and that are output by the quadrature frequency-mixing circuit.

In the foregoing technical solution, each of the plurality of receiving channels includes the transconductance stage circuit, and the first transconductance unit array and the second transconductance unit array in the transconductance stage circuit may be configured to convert one channel of signals received by the corresponding coupled antenna element into two channels of signals. After quadrature frequency mixing processing is implemented on the two channels of signals by the quadrature frequency-mixing circuit, phase shifting of a signal transmitted in the receiving channel may be implemented. In addition, the two transconductance unit arrays of different receiving channels are both coupled to the quadrature frequency-mixing circuit, to combine signals at the quadrature frequency-mixing circuit. Therefore, compared with a conventional technology, in this application, passive phase shifters and power splitting and combining networks do not need to be independently disposed for different receiving channels. Therefore, an area of the phased array apparatus is reduced.

In a possible implementation of the first aspect, the first transconductance unit array and the second transconductance unit array in each of the plurality of receiving channels have a phase shift function. In the foregoing possible implementation, the first transconductance unit array and the second transconductance unit array in a same receiving channel may be configured to convert one channel of voltage signals received by the corresponding coupled antenna element into two channels of current signals. After quadrature frequency mixing processing is implemented on the two channels of current signals by the quadrature frequency-mixing circuit, phase shifting of the signal transmitted in the receiving channel may be implemented, so that different phase shifting may be implemented, by adjusting amplitudes of the two channels of current signals, after the quadrature frequency mixing processing. Therefore, an independent passive phase shifter does not need to be disposed for the receiving channel, to further reduce the area of the phased array apparatus.

In a possible implementation of the first aspect, the first transconductance unit array and the second transconductance unit array each include a plurality of transconductance stages, and a quantity of conducted transconductance stages in the plurality of transconductance stages is adjustable. In the foregoing possible implementation, for each of the plurality of receiving channels, the quantity of conducted transconductance stages in the plurality of transconductance stages included in the two transconductance unit arrays in the receiving channel may be adjusted to implement phase shifting at different angles on the signal transmitted in the receiving channel. Therefore, the area of the phased array apparatus is reduced.

In a possible implementation of the first aspect, each of the plurality of transconductance stages included in each transconductance unit array in the first transconductance unit array and the second transconductance unit array is correspondingly provided with a corresponding bias control circuit, and the bias control circuit may be configured to control conduction or disconnection of the transconductance stage. For example, the bias control circuit may be configured to output a bias voltage that controls the conduction or disconnection of the transconductance stage. Therefore, a quantity of conducted or disconnected transconductance stages in the transconductance unit array may be controlled by using a plurality of bias control circuits corresponding to the plurality of transconductance stages. In the foregoing possible implementation, the quantity of conducted transconductance stages in the plurality of transconductance stages may be effectively controlled by using the bias control circuit corresponding to each of the plurality of transconductance stages, so that the quantity of conducted transconductance stages in the two transconductance unit arrays may be adjusted to implement phase shifting at different angles on the signal transmitted in the receiving channel.

In a possible implementation of the first aspect, the first transconductance unit array and the second transconductance unit array each are provided with a first control circuit and a second control circuit, respectively configured to control a quantity of conducted or disconnected transconductance stages in the first transconductance unit array and a quantity of conducted or disconnected transconductance stages in the second transconductance unit array respectively. In the foregoing possible implementation, the quantity of conducted transconductance stages in the first transconductance unit array and the quantity of conducted transconductance stages of the second transconductance unit array may be adjusted by using the first control circuit and the second control circuit, so that phase shifting at different angles may be implemented on the signal transmitted in the receiving channel.

In a possible implementation of the first aspect, each control circuit in the first control circuit and the second control circuit includes a switch stage circuit coupled to the transconductance stage in a one-to-one correspondence, and the switch stage circuit is configured to control the conduction or disconnection of the corresponding transconductance stage. In the foregoing possible implementation, a simple and effective switch stage circuit is provided, and is configured to control the conduction or disconnection of the corresponding transconductance stage.

In a possible implementation of the first aspect, the transconductance stage in the first transconductance unit array and the second transconductance unit array includes: a first metal oxide semiconductor MOS transistor and a second MOS transistor, where a gate of the first MOS transistor and a gate of the second MOS transistor each are used as an input end of the transconductance stage, a source of the first MOS transistor and a source of the second MOS transistor are coupled to a first node, and a drain of the first MOS transistor and a drain of the second MOS transistor each are used as an output end of the transconductance stage. Optionally, the transconductance stage further includes: a tail current transistor coupled between the first node and a grounding end. In the foregoing possible implementation, a structure of an active transconductance stage in a transconductance unit array is provided. The transconductance stage may be configured to convert a differential voltage signal into a differential current signal. Because the transconductance stage is implemented based on a plurality of MOS transistors, the area of the phased array apparatus is reduced.

In a possible implementation of the first aspect, the switch stage circuit is provided with a first signal generator and a second signal generator, and the first signal generator and the second signal generator are respectively configured to generate a switch signal for conducting the switch stage circuit and a switch signal for disconnecting the switch stage circuit. In the foregoing possible implementation, a simple and effective manner of controlling conduction and disconnection of the switch stage circuit is provided.

In a possible implementation of the first aspect, the switch stage circuit includes: a third MOS transistor, a fourth MOS transistor, a fifth MOS transistor, and a sixth MOS transistor. A gate of the third MOS transistor and a gate of the sixth MOS transistor each are configured to receive a positive-phase switch signal, and a gate of the fourth MOS transistor and a gate of the fifth MOS transistor each are configured to receive a negative-phase switch signal. A source of the third MOS transistor and a source of the fourth MOS transistor each are coupled to a second node, a source of the fifth MOS transistor and a source of the sixth MOS transistor each are coupled to a third node, and the second node and the third node each are an input end of the switch stage circuit. A drain of the third MOS transistor and a drain of the fifth MOS transistor each are coupled to a fourth node, a drain of the fourth MOS transistor and a drain of the sixth MOS transistor each are coupled to a fifth node, and the fourth node and the fifth node each are an output end of the switch stage circuit. In the foregoing possible implementation, a structure of an active switch stage circuit is provided. The switch stage circuit is implemented based on a plurality of MOS transistors. Therefore, the area of the phased array apparatus is reduced.

In a possible implementation of the first aspect, the quadrature frequency-mixing circuit includes: a first quadrature mixer having a first non-inverting input end and a first quadrature input end, a second quadrature mixer having a second non-inverting input end and a second quadrature input end, and a local oscillator signal generator having a non-inverting output end and a quadrature output end. The first non-inverting input end, as the non-inverting input end of the quadrature frequency-mixing circuit, is coupled to the output end of the first transconductance unit array in the plurality of receiving channels; the second quadrature input end, as the quadrature input end of the quadrature frequency-mixing circuit, is coupled to the output end of the second transconductance unit array in the plurality of receiving channels; the first quadrature input end is coupled to the quadrature output end of the local oscillator signal generator; and the second non-inverting input end is coupled to the non-inverting output end of the local oscillator signal generator. In the foregoing possible implementation, the quadrature frequency-mixing circuit may be configured to perform quadrature mixing processing on current signals output by different transconductance unit arrays in a same receiving channel, and current signals of different receiving channels may be combined, to combine signals in different receiving channels.

In a possible implementation of the first aspect, each quadrature mixer in the first quadrature mixer and the second quadrature mixer includes: a seventh MOS transistor, an eighth MOS transistor, a ninth MOS transistor, and a tenth MOS transistor. A gate of the seventh MOS transistor and a gate of the tenth MOS transistor each are configured to receive a positive-phase local oscillator signal, and a gate of the eighth MOS transistor and a gate of the ninth MOS transistor each are configured to receive a negative-phase local oscillator signal. A source of the seventh MOS transistor and a source of the eighth MOS transistor are coupled to a sixth node, and a source of the ninth MOS transistor and a source of the tenth MOS transistor are coupled to a seventh node. A drain of the seventh MOS transistor and a drain of the ninth MOS transistor are coupled to an eighth node, and a drain of the eighth MOS transistor and a drain of the tenth MOS transistor are coupled to a ninth node. A sixth node and a seventh node in the first quadrature mixer are respectively coupled to a sixth node and a seventh node in the second quadrature mixer, to serve as output ends of the quadrature frequency-mixing circuit. When the quadrature mixer is the first quadrature mixer, the sixth node and the seventh node each are used as the first non-inverting input end. When the quadrature mixer is the second quadrature mixer, the sixth node and the seventh node each are used as the second quadrature input end. In the foregoing possible implementation, a structure of an active quadrature mixer is provided. The quadrature mixer may perform quadrature mixing processing on different differential current signals. The quadrature mixer is implemented based on a plurality of MOS transistors. Therefore, the area of the phased array apparatus is reduced.

In a possible implementation of the first aspect, each of the plurality of receiving channels further includes: a low noise amplifier, where an input end of the low noise amplifier is coupled to the antenna element corresponding to the receiving channel, and an output end of the low noise amplifier is separately coupled to the input end of the first transconductance unit array and the input end of the second transconductance unit array. In the foregoing possible implementation, low noise amplifier in each receiving channel may be used to amplify power of a voltage signal received by the receiving channel.

In a possible implementation of the first aspect, the signal processing circuit includes: one or more of a transformer, a capacitor, a drive amplifier, a low-pass filter, and an analog-to-digital converter coupled to the output end of the quadrature frequency-mixing circuit. In the foregoing possible implementation, a possible structure of a signal processing circuit configured to process a signal is provided.

According to a second aspect, a chip module is provided, including: a chip and a package substrate. The chip is fastened to the package substrate, the chip includes any phased array apparatus according to any one of the first aspect or the possible implementations of the first aspect. The package substrate includes an antenna array having a plurality of antenna elements, and the plurality of antenna elements are coupled to a plurality of receiving channels.

According to a third aspect, a communication device is provided. The communication device includes the phased array apparatus according to any one of the first aspect or the possible implementations of the first aspect.

It may be understood that any chip module and communication device provided above include all content of the phased array apparatus provided above. Therefore, for beneficial effects that can be achieved by the chip module and communication device, refer to the beneficial effects of the phased array apparatus provided above. Details are not described herein again.

DESCRIPTION OF EMBODIMENTS

Figure 1:
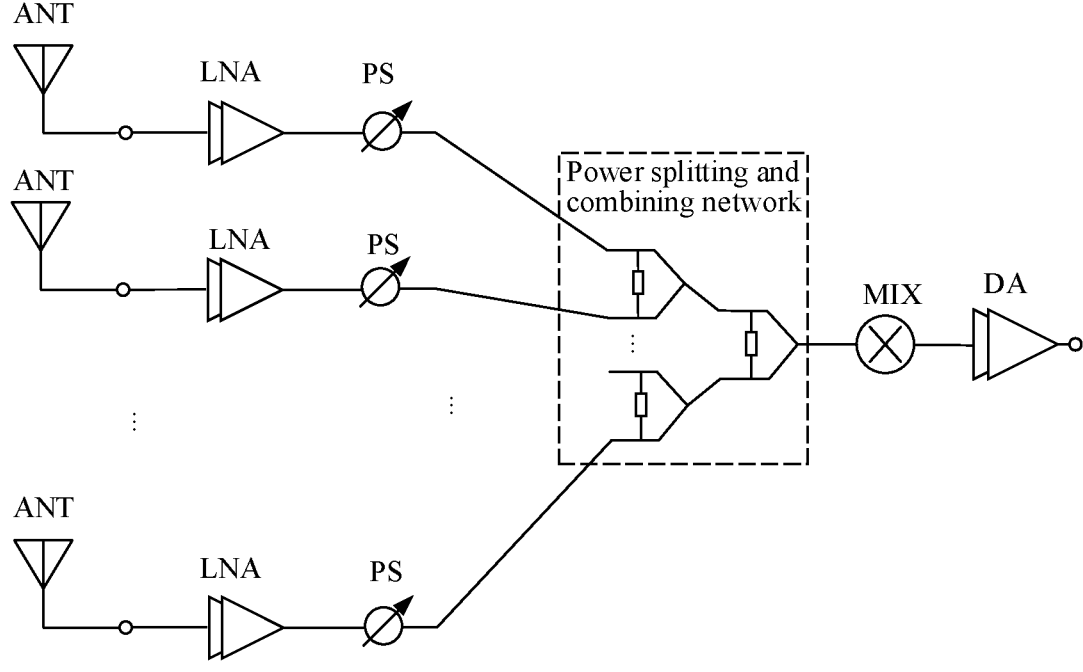
FIG. 1 is a schematic diagram of a phased array architecture according to an embodiment of this application.

The manufacture and use of embodiments are discussed in detail below. It should be appreciated, however, that this application provides many applicable inventive concepts that can be embodied in a wide variety of specific contexts. Specific embodiments discussed are merely illustrative of specific ways to implement and use this specification and the present technology, and do not limit the scope of this application.

Unless otherwise defined, all technical and scientific terms used herein have a same meaning as commonly understood by a person of ordinary skill in the art to which this application pertains.

Each circuit or another component may be described as or referred to as being "configured to" perform one or more tasks. In this case, the term "configured to" is used to imply a structure by indicating that the circuit/component includes a structure (for example, a circuit system) performing one or more tasks during operation. Therefore, even when the specified circuit/component is currently not operable (for example, not open), the circuit/component may also be referred to as being used to perform the task. The circuit/component used in conjunction with the term "configured to" includes hardware, for example, a circuit that performs operations.

The following describes the technical solutions in embodiments of this application with reference to the accompanying drawings in embodiments of this application. In this application, "at least one" means one or more, and "a plurality of" means two or more. The term "and/or" describes an association relationship between associated objects and indicates that three relationships may exist. For example, A and/or B may indicate the following three cases: Only A exists, both A and B exist, and only B exists, where A and B may be singular or plural. The character "/" generally indicates an "or" relationship between the associated objects. "At least one of the following items (pieces)" or a similar expression means any combination of these items, including any combination of a singular item (piece) or plural items (pieces). For example, at least one of a, b, or c may indicate: a, b, c, a and b, a and c, b and c, or a, b and c, where a, b, and c may be singular or may be plural.

In embodiments of this application, words such as "first" and "second" are used to distinguish between objects having similar names, functions, or purposes. A person of ordinary skill in the art may understand that the words such as "first" and "second" do not limit a quantity and an execution order. The term "coupling" indicates an electrical connection, including a direct connection performed by using a wire or a connection end or an indirect connection perform by using another device. Therefore, the term "coupling" should be considered as an electronic communication connection in a broad sense.

It should be noted that, in this application, the word such as "example" or "for example" is used to represent giving an example, an illustration, or a description. Any embodiment or design scheme described as an "example" or "for example" in this application should not be explained as being more preferred or having more advantages than another embodiment or design scheme. Exactly, use of the word such as "example" or "for example" is intended to present a related concept in a specific manner.

The technical solutions provided in this application may be applied to high-frequency millimeter wave communication. A high-frequency millimeter wave, applicable to an application scenario with large bandwidth and a large data rate, has rich spectrum resources and high bandwidth, and is widely used in fields including 5G communication, microwave backhaul, indoor short-range communication, and the like.

A space loss of the high-frequency millimeter wave in a channel is large, and a transmission characteristic is closer to direct transmission. Because a phased array technology can be used to implement more centralized energy transmission, and signal directivity is better, the phased array technology is usually used to implement high-frequency millimeter wave communication.

In this application, a communication device using the phased array technology may be deployed on land, and includes an indoor device, an outdoor device, a handheld device, or a vehicle-mounted device. The communication device may alternatively be deployed on water (for example, on a ship), or may be deployed in the air (for example, on an airplane, a balloon, or a satellite). For example, the communication device may be a terminal, a base station, or the like. For example, the terminal includes but is not limited to: a mobile phone, a tablet computer, a notebook computer, a palmtop computer, a mobile internet device (MID), a wearable device (such as a smartwatch, a smart band, or a pedometer), a vehicle-mounted device (such as an automobile a bicycle, an electric vehicle, an airplane, a ship, a train, or a high-speed train), a virtual reality (VR) device, an augmented reality (AR) device, a terminal in industrial control, a smart home device (such as a refrigerator, a television, an air conditioner, or an electricity meter), an intelligent robot, a workshop device, a terminal in self-driving, a terminal in remote surgery (remote medical surgery), a terminal in a smart grid, a terminal in transportation safety, a terminal in a smart city, a terminal in a smart home, a flight device (such as an intelligent robot, a hot balloon, an unmanned aerial vehicle, or an aircraft), or the like.

FIG. 1 is a schematic diagram of a phased array architecture. The multi-band phased array includes at least two phased array channels (where two phased array channels are used as an example for description in FIG. 1). Each phased array channel may support receiving and sending of signals of two frequency bands (that is, B1 and B2). Each phased array channel includes an antenna (ANT), a switch (SW), and a front-end circuit and a phase shifter (PS) that correspond to two frequency bands and that are separately coupled to the switch SW in sequence. PSs of a same frequency band in different phased array channels are separately coupled by using one power splitting and combining network, and are connected to a frequency mixing and amplification circuit of the corresponding frequency band after the coupling. The front-end circuit in FIG. 1 includes a power amplifier (PA) and a switch that are coupled in sequence, and a low noise amplifier (LNA) and a switch that are coupled in sequence. The frequency mixing and amplification circuit includes a switch, a mixer (MIX), and a drive amplifier (DA) that are coupled in sequence.

In the architecture of the phased array shown in FIG. 1, phase shifting of each phased array channel is implemented by performing phase shifting on radio frequency signals of different frequency bands. In addition, one-level or multiple-level phase shifters of corresponding frequency bands need to be used for the radio frequency signals of different frequency bands. Consequently, an area of the phased array is large.

Figure 2:
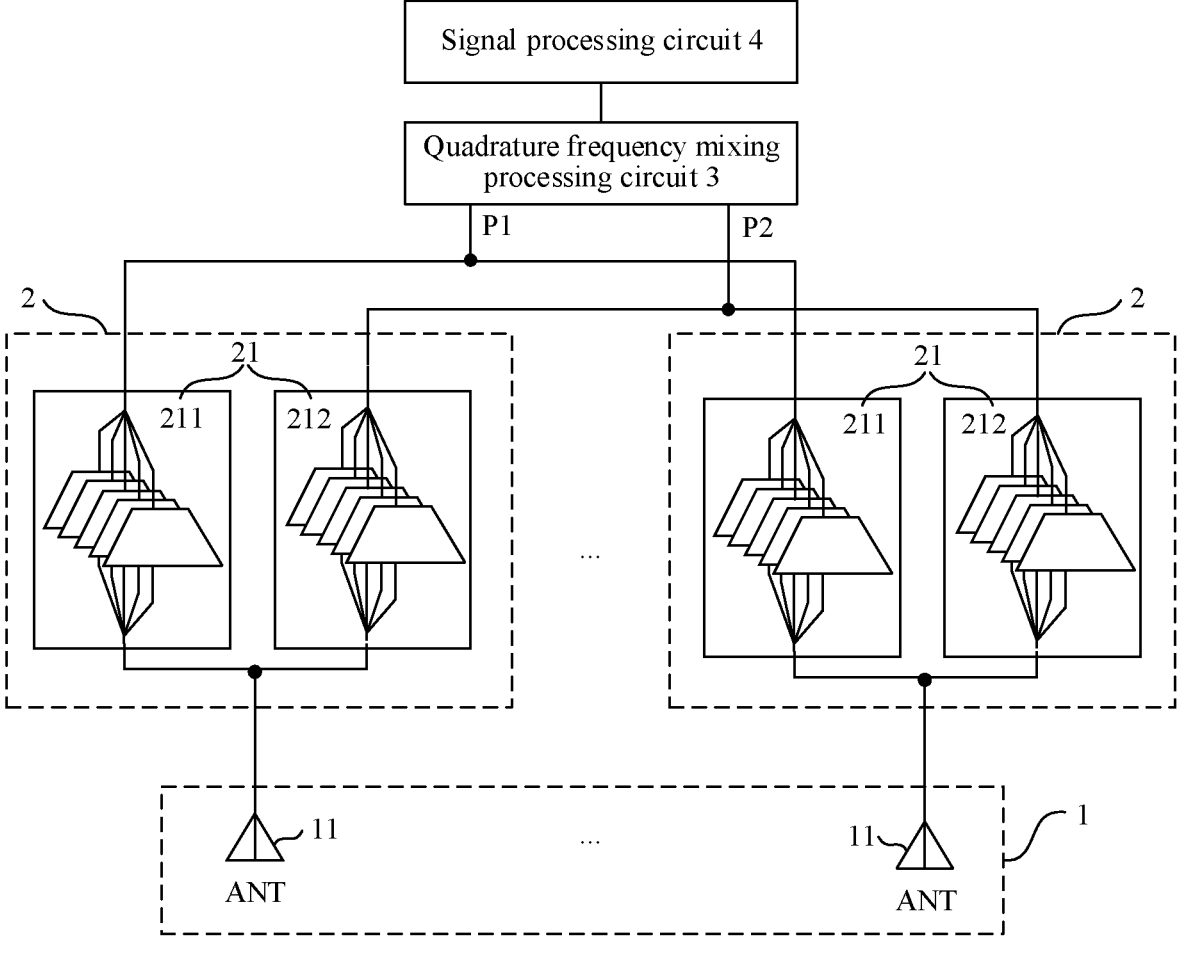
FIG. 2 is a schematic structural diagram of a phased array apparatus according to an embodiment of this application.

FIG. 2 is a schematic structural diagram of a phased array apparatus according to an embodiment of this application. The phased array apparatus may be a communication device, or may be a module used in a communication device. As shown in FIG. 2, the phased array apparatus may include: a plurality of receiving channels 2, a quadrature frequency-mixing circuit 3, and a signal processing circuit 4 coupled to an antenna array 1.

The antenna array 1 includes a plurality of antenna elements 11. The plurality of antenna elements 11 may include two or more antenna elements 11, and each antenna element 11 may be configured to receive a radio frequency signal of a first frequency band. The radio frequency signal may be a voltage signal. The voltage signal may be a single-ended voltage signal or a differential voltage signal, and the first frequency band may be a millimeter wave band.

The plurality of receiving channels 2 are coupled to the plurality of antenna elements 11. For example, each of the plurality of receiving channels 2 may be coupled to one antenna element 11 in the plurality of antenna elements 11. Each of the plurality of receiving channels 2 includes a transconductance stage circuit 21, and the transconductance stage circuit 21 includes a first transconductance unit array 211 and a second transconductance unit array 212. An input end of the first transconductance unit array 211 and an input end of the second transconductance unit array 212 in each receiving channel 2 are coupled to the antenna element 11 corresponding to the receiving channel 2. The first transconductance unit array 211 and the second transconductance unit array 212 are configured to convert a voltage signal received by the antenna element 11 into a current signal. In other words, the transconductance stage circuit 21 may be configured to convert one channel of voltage signals into two channels of current signals.

The quadrature frequency-mixing circuit 3 includes a non-inverting input end P1 and a quadrature input end P2. The non-inverting input end P1 is coupled to an output end of each of the first transconductance unit arrays 211 in the plurality of receiving channels 2, and the quadrature input end P2 is coupled to an output end of each of the second transconductance unit arrays 212 in the plurality of receiving channels 2. The quadrature frequency-mixing circuit 3 may be configured to perform quadrature frequency mixing processing on a current signal output by the first transconductance unit array 211 and a current signal output by the second transconductance unit array 212 in the plurality of receiving channels 2. Current signals of different receiving channels 2 may be combined at the quadrature frequency-mixing circuit 3.

The signal processing circuit 4 includes an input end. The input end of the signal processing circuit 4 is coupled to an output end of the quadrature frequency-mixing circuit 3. The signal processing circuit 4 may be configured to perform amplification, filtering, analog-to-digital conversion, and the like on a current signal output by the quadrature frequency-mixing circuit 3.

In this embodiment of this application, each of the plurality of receiving channels 2 includes the transconductance stage circuit 21, and the first transconductance unit array 211 and the second transconductance unit array 212 in the transconductance stage circuit 21 may be configured to convert one channel of voltage signals received by the antenna element 11 into two channels of current signals. After quadrature frequency mixing processing is implemented on the two channels of current signals by the quadrature frequency-mixing circuit 3, phase shifting of a signal transmitted in the receiving channel may be implemented, and signals transmitted in the plurality of receiving channels 2 may be combined. Therefore, compared with a conventional technology, in this application, passive phase shifters and power splitting and combining networks do not need to be independently disposed for different receiving channels. Therefore, an area of the phased array is reduced.

Further, the first transconductance unit array 211 and the second transconductance unit array 212 each include a plurality of transconductance stages, and a quantity of conducted transconductance stages in the plurality of transconductance stages is adjustable. In this way, for each receiving channel 2, the quantity of conducted transconductance stages in the plurality of transconductance stages included in the two transconductance unit arrays in the receiving channel 2 may be adjusted to implement phase shifting at different angles on the signal transmitted in the receiving channel 2.

For example, it is assumed that Formula (1) shows a voltage signal corresponding to a radio frequency signal received by an antenna element 11 corresponding to a receiving channel 2. To be specific, Formula (1) shows a voltage signal received by each of a first transconductance unit array 211 and a second transconductance unit array 212 in the receiving channel 2. In this case, Formula (2) and Formula (3) may show two channels of current signals output by the first transconductance unit array 211 and the second transconductance unit array 212, respectively. Formula (4) and Formula (5) may show circuit signals obtained by performing quadrature frequency mixing processing on the two channels of current signals respectively by the quadrature frequency-mixing circuit 3, and Formula (6) may show a current signal output after current signals obtained through frequency mixing processing are accumulated.

$$Vin\_I = A\cos(wt) \tag{1}$$

$$Iout\_I = A\cos(wt) \times g_m \times M \tag{2}$$

$$Iout\_Q = A\cos(wt) \times g_m \times N \tag{3}$$

$$Iout\_mixer\_I = G_{mixer} \times A\cos(w - w_{lo})t \times g_m \times M \tag{4}$$

$$Iout\_mixer\_Q = G_{mixer} \times A\sin(w - w_{lo})t \times g_m \times N \tag{5}$$

$$Iout = Iout\_mixer\_I + Iout\_mixer\_Q = \tag{6}$$
$$G_{mixer} \times A \times g_m \times [M \times \cos(w - w_{lo})t + N \times \sin(w - w_{lo})t] =$$
$$G_{mixer} \times A \times g_m \times \sqrt{M^2 + N^2} \times \cos(wt + \varphi), \varphi = \arctan\frac{N}{M}$$

In the formulas, M is a quantity of conducted transconductance stages in the first transconductance unit array 211, N is a quantity of conducted transconductance stages in the second transconductance unit array 212, $g_m$ is a transconductance coefficient of each of the first transconductance unit array 211 and the second transconductance unit array 212, $G_{mixer}$ is a frequency-mixing coefficient of the quadrature frequency-mixing circuit 3, and $W_{lo}$ is an angular frequency of a local oscillator signal used for quadrature frequency mixing processing.

With reference to the foregoing Formula (1) to Formula (6), it can be learned that, a phase of the signal transmitted in the receiving channel 2 may be adjusted to φ, and a value of φ is related to M and N. In this way, the quantity of conducted transconductance stages in the plurality of transconductance stages included in the first transconductance unit array 211 and the second transconductance unit array 212 in the receiving channel 2 is adjusted to implement phase shifting at different angles on the signal transmitted in the receiving channel 2.

Further, the quantity of conducted transconductance stages in the plurality of transconductance stages included in the first transconductance unit array 211 and the second transconductance unit array 212 may be adjusted in the following two manners. Details are described as follows.

In a first manner, each of the plurality of transconductance stages included in each transconductance unit array in the first transconductance unit array 211 and the second transconductance unit array 212 is correspondingly provided with a bias control circuit, and the bias control circuit may be configured to control conduction or disconnection of the transconductance stage. For example, the bias control circuit may be configured to output a bias voltage that controls the conduction or disconnection of the transconductance stage. Therefore, a quantity of conducted or disconnected transconductance stages in the transconductance unit array may be controlled by using a plurality of bias control circuits corresponding to the plurality of transconductance stages.

Figure 3:
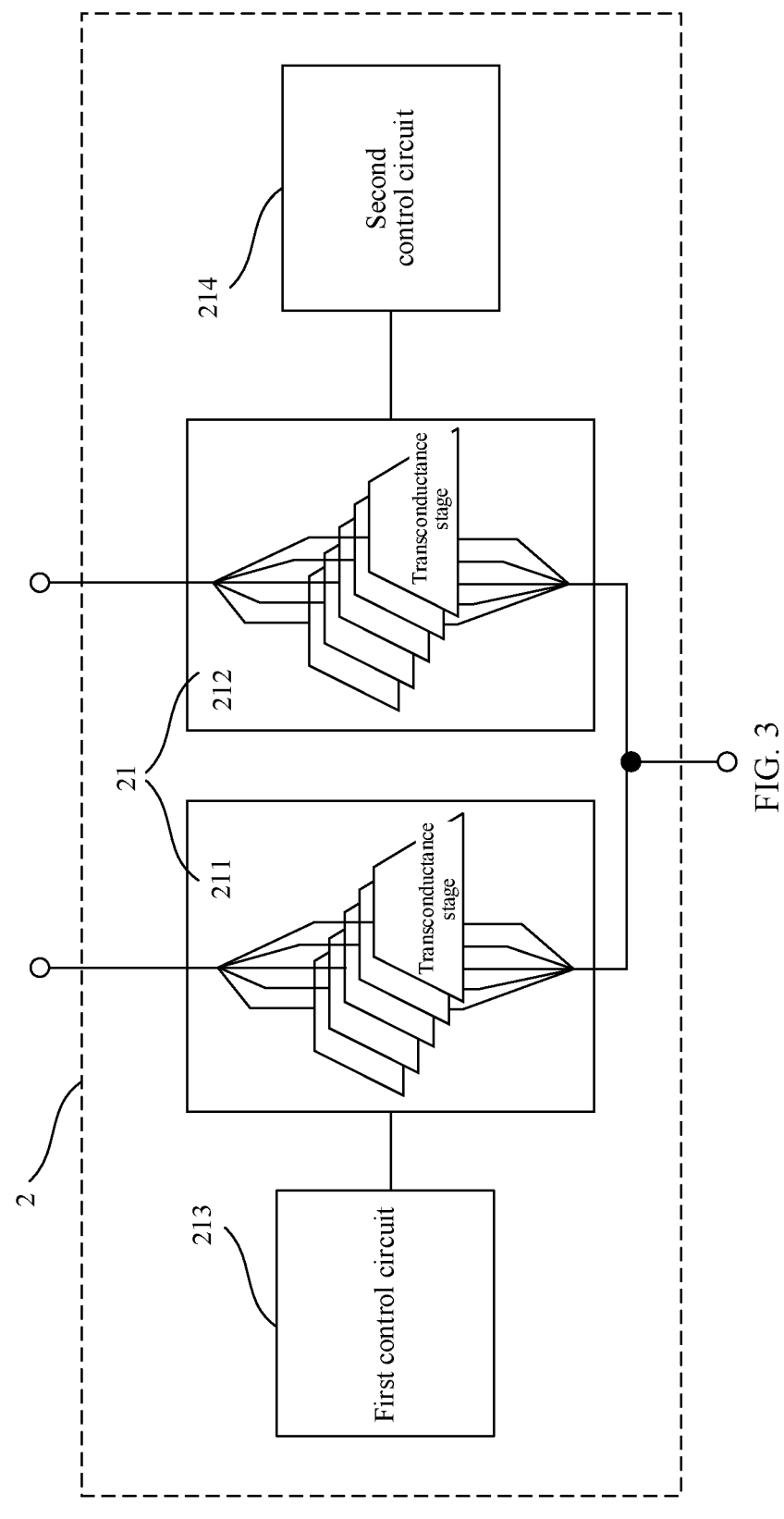
FIG. 3 is a schematic structural diagram of a receiving channel according to an embodiment of this application.

In a second manner, as shown in FIG. 3, the first transconductance unit array 211 and the second transconductance unit array 212 in a same receiving channel 2 each are provided with a first control circuit 213 and a second control circuit 214, respectively configured to control a quantity of conducted or disconnected transconductance stages in the first transconductance unit array 211 and a quantity of conducted or disconnected transconductance stages in the second transconductance unit array 212.

For example, each control circuit in the first control circuit 213 and the second control circuit 214 may include a plurality of switch stage circuits. The plurality of switch stage circuits are coupled to the plurality of transconductance stages in the corresponding transconductance unit array in a one-to-one correspondence. A switch stage circuit that is correspondingly coupled to one transconductance stage may be configured to control conduction or disconnection of the transconductance stage. Optionally, the switch stage circuit may be provided with a first signal generator and a second signal generator, and the first signal generator and the second signal generator may be respectively configured to generate a switch signal for conducting the switch stage circuit and a switch signal for disconnecting the switch stage circuit, so that disconnection or conduction of the switch stage circuit can be controlled by using the first signal generator and the second signal generator.

Both the foregoing two implementations may be applied to a scenario in which the corresponding antenna element 11 is configured to receive a single-ended voltage signal and a scenario in which the corresponding antenna element 11 is configured to receive a differential voltage signal. A structure of the transconductance stage in the first transconductance unit array 211 and the second transconductance unit array 212, the bias control circuit corresponding to each transconductance stage, and the switch stage circuit corresponding to each transconductance stage vary with the voltage signal received by the antenna element 11. The following mainly describes in detail structures of the transconductance stage and the switch stage circuit by using an example in which the antenna element 11 is configured to receive a single-ended voltage signal and configured to receive a differential voltage signal in the second manner.

Figure 4:
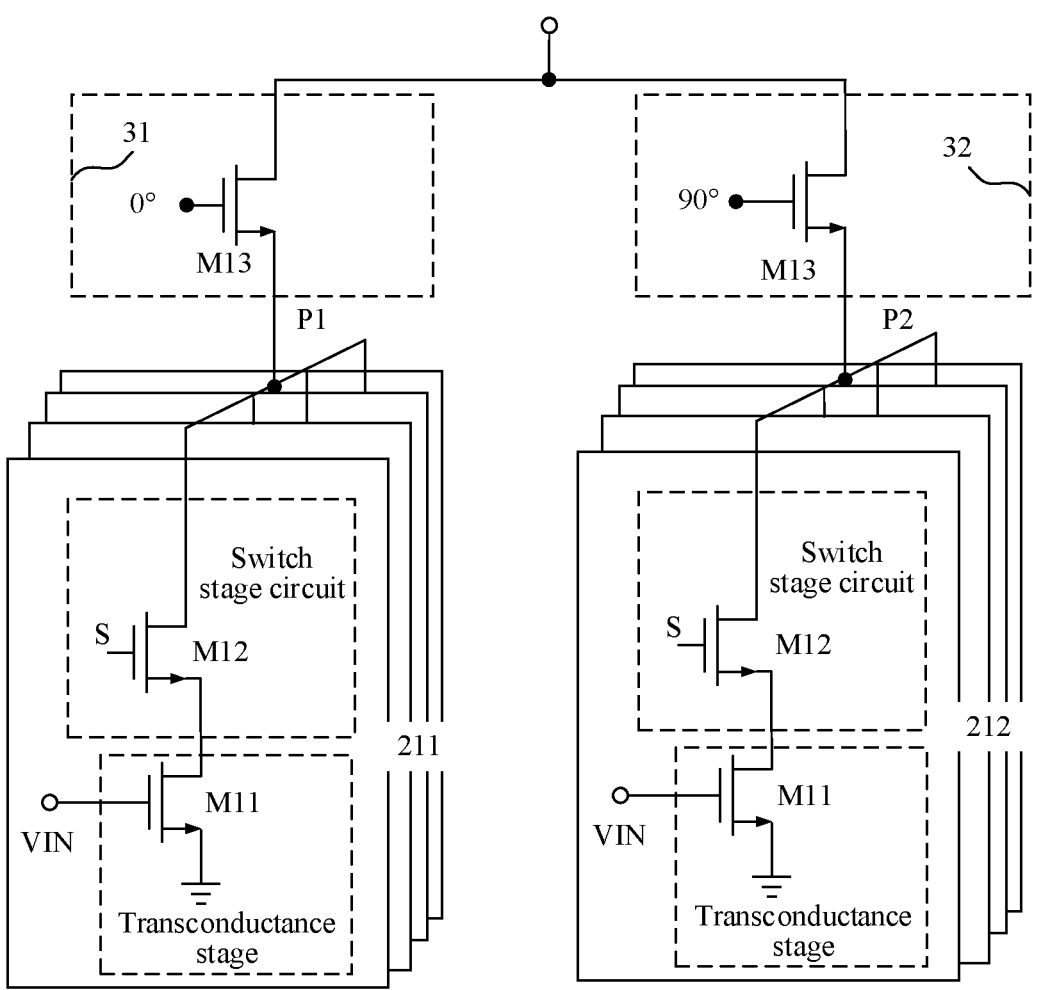
FIG. 4 is a schematic structural diagram of another phased array apparatus according to an embodiment of this application.

When the antenna element 11 is configured to receive a single-ended voltage signal, as shown in FIG. 4, the transconductance stage may include: a first metal oxide semiconductor (MOS) transistor M11. A gate of the first MOS transistor M11 is used as an input end of the transconductance stage, and is configured to receive the single-ended voltage signal VIN. A source of the first MOS transistor M11 is coupled to a grounding end. A drain of the first MOS transistor M11 is used as an output end of the transconductance stage, and is configured to output a single-ended current signal. Correspondingly, as shown in FIG. 4, the switch stage circuit may include: a second MOS transistor M12. A source of the second MOS transistor M12 is coupled to the output end of the corresponding transconductance stage, a drain of the second MOS transistor M12 is used as an output end of the switch stage circuit, and a gate of the second MOS transistor M13 is configured to receive a switch signal S.

Specifically, after receiving the single-ended voltage signal by using the gate of the first MOS transistor M11, the transconductance stage may convert the single-ended voltage signal into a single-ended current signal, and output the single-ended current signal from the drain of the first MOS transistor M11, in other words, output the single-ended current signal from the output end of the transconductance stage. When the second MOS transistor M12 in the switch stage circuit is conducted, the switch stage circuit is in a conducted state, so that the single-ended current signal output by the transconductance stage is transmitted to the quadrature frequency-mixing circuit 3. When the second MOS transistor M12 in the switch stage circuit is disconnected, the switch stage circuit is in a disconnected state. In this case, the transconductance stage corresponding to the switch stage circuit is in a disconnected state.

Figure 5:
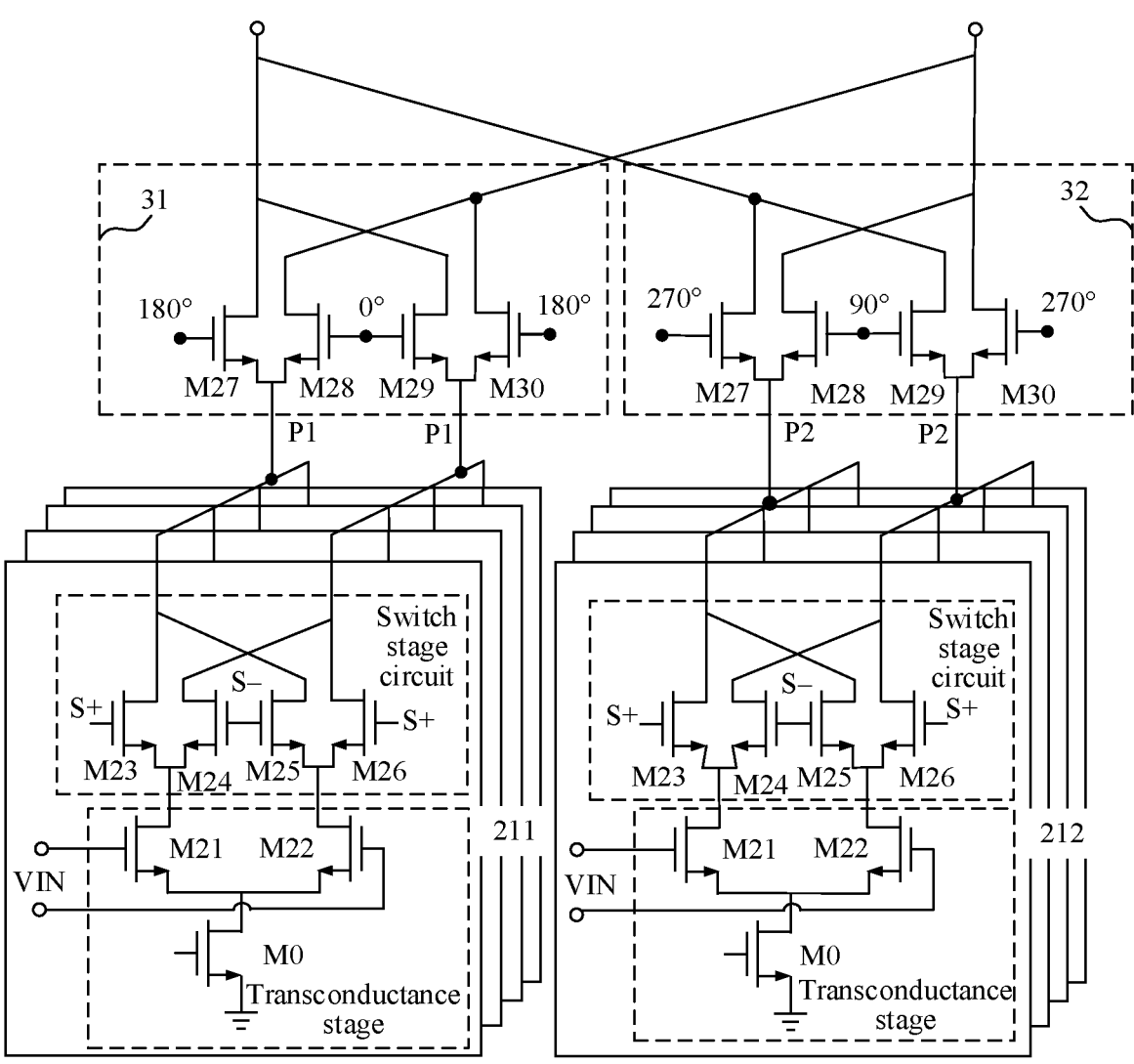
FIG. 5 is a schematic structural diagram of still another phased array apparatus according to an embodiment of this application.

When the antenna element 11 is configured to receive a differential voltage signal, as shown in FIG. 5, the transconductance stage may include: a first MOS transistor M21 and a second MOS transistor M22. A gate of the first MOS transistor M21 and a gate of the second MOS transistor M22 each are used as a differential input end of the transconductance stage, and are configured to receive the differential voltage signal VIN. A source of the first MOS transistor M21 and a source of the second MOS transistor M22 are coupled to a first node. A drain of the first MOS transistor M21 and a drain of the second MOS transistor M22 each are used as a differential output end of the transconductance stage, and are configured to differentiate a current signal. Optionally, the transconductance stage may further include: a tail current transistor MO coupled between the first node and the grounding end. The tail current transistor MO may be a MOS transistor. For example, the MOS transistor is coupled to the first node and the grounding end by using a source and a drain respectively, and a gate of the MOS transistor is configured to receive a bias voltage signal.

Correspondingly, as shown in FIG. 5, the switch stage circuit may include: a third MOS transistor M23, a fourth MOS transistor M24, a fifth MOS transistor M25, and a sixth MOS transistor M26. A gate of the third MOS transistor M23 and a gate of the sixth MOS transistor M26 each are configured to receive a positive-phase switch signal S+, a gate of the fourth MOS transistor M24 and a gate of the fifth MOS transistor M25 each are configured to receive a negative-phase switch signal S−, and the positive-phase switch signal S+ and the negative-phase switch signal S− form a differential switch signal used to conduct or disconnect the switch stage circuit. A source of the third MOS transistor M23 and a source of the fourth MOS transistor M24 are coupled to a second node, a source of the fifth MOS transistor M25 and a source of the sixth MOS transistor are coupled to a third node, the second node and the third node each are an input end of the switch stage circuit, and the input end of the switch stage circuit may be configured to receive a differential current signal output by the corresponding transconductance stage. A drain of the third MOS transistor M23 and a drain of the fifth MOS transistor M25 are coupled to a fourth node, a drain of the fourth MOS transistor M24 and a drain of the sixth MOS transistor M26 are coupled to a fifth node, the fourth node and the fifth node each are a differential output end of the switch stage circuit, and the differential output end may be configured to output the differential current signal.

Specifically, after receiving the differential voltage signal by using the gate of the first MOS transistor M21 and the gate of the second MOS transistor M22, the transconductance stage may convert the differential voltage signal into a differential current signal, and output the differential current signal from the drain of the first MOS transistor M21 and the drain of the second MOS transistor M22, in other words, output the differential current signal from the differential output end of the transconductance stage. When the third MOS transistor M23, the fourth MOS transistor M24, the fifth MOS transistor M25, and the sixth MOS transistor M26 in the switch stage circuit are all conducted, the switch stage circuit is in a conducted state, so that the differential current signal output by the transconductance stage is transmitted to the quadrature frequency-mixing circuit 3. When the third MOS transistor M23, the fourth MOS transistor M24, the fifth MOS transistor M25, and the sixth MOS transistor M26 in the switch stage circuit are all disconnected, the switch stage circuit is in a disconnected state. In this case, the transconductance stage corresponding to the switch stage circuit is in a disconnected state.

It should be noted that the MOS transistors in the transconductance stage and the switch stage circuit may be NMOS transistors, or may be PMOS transistors. In FIG. 4 and FIG. 5, the PMOS transistors are merely used as an example for description. Structures of the transconductance stages and the switch stage circuits in FIG. 4 and FIG. 5 do not constitute a limitation on this embodiment of this application.

Further, the quadrature frequency-mixing circuit 3 may include a first quadrature mixer 31 having a first non-inverting input end and a first quadrature input end, a second quadrature mixer 32 having a second non-inverting input end and a second quadrature input end, and a local oscillator signal generator 33 having a non-inverting output end and a quadrature output end. The first non-inverting input end, as the non-inverting input end P1 of the quadrature frequency-mixing circuit 3, is coupled to the output end of the first transconductance unit array 211 in the plurality of receiving channels 2; the second quadrature input end, as the quadrature input end P2 of the quadrature frequency-mixing circuit 3, is coupled to the output end of the second transconductance unit array 212 in the plurality of receiving channels 2; the first quadrature input end is coupled to the quadrature output end of the local oscillator signal generator 33; and the second non-inverting input end is coupled to the non-inverting output end of the local oscillator signal generator 33.

Figure 6:
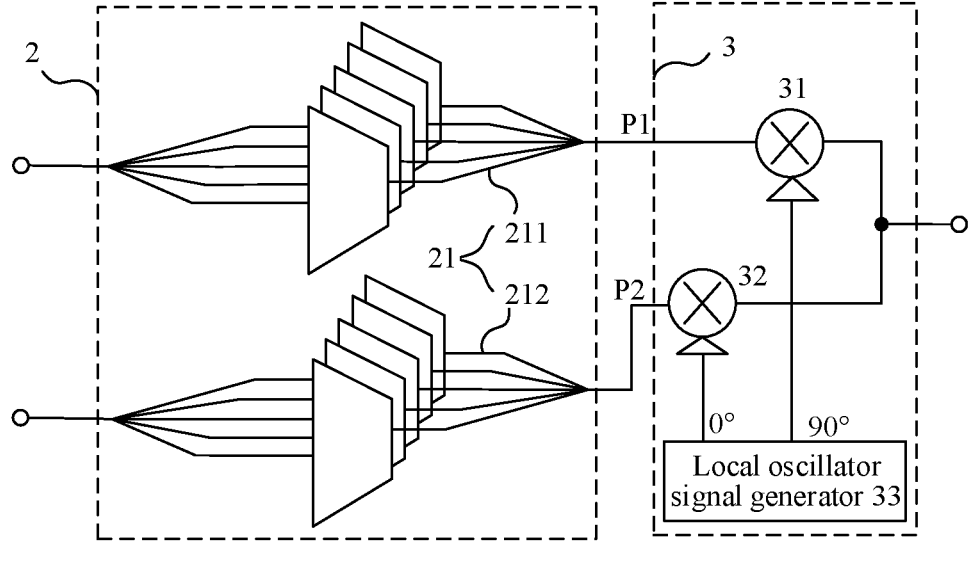
FIG. 6 is a schematic structural diagram of a quadrature frequency-mixing circuit according to an embodiment of this application.

For example, as shown in FIG. 6, one receiving channel 2 in the plurality of receiving channels 2 is used as an example. An output end of a first transconductance unit array 211 in the receiving channel 2 may be coupled to a first non-inverting input end of a first quadrature mixer 31, an output end of a second transconductance unit array 212 may be coupled to a second quadrature input end of a second quadrature mixer 32, a first quadrature input end of the first quadrature mixer 31 may be coupled to a quadrature output end of a local oscillator signal generator 33, a second non-inverting input end of the second quadrature mixer 32 may be coupled to a non-inverting input end of the local oscillator signal generator 33, and an output end of the first quadrature mixer 31 and an output end of the second quadrature mixer 32 are coupled to each other, to be used as an output end of the quadrature frequency-mixing circuit 3.

The quadrature frequency-mixing circuit shown in FIG. 6 is also applicable to the scenario in which the corresponding antenna element 11 is configured to receive a single-ended voltage signal and the scenario in which the corresponding antenna element 11 is configured to receive a differential voltage signal. The following separately describes in detail specific structures of the first quadrature mixer 31 and the second quadrature mixer 32 in the two cases.

When the antenna element 11 is configured to receive a single-ended voltage signal, as shown in FIG. 4, each quadrature mixer in the first quadrature mixer 31 and the second quadrature mixer 32 may include: a third MOS transistor M13. A source of the third MOS transistor M13 is used as an input end of the quadrature mixer, a drain of the third MOS transistor M13 is used as an output end of the quadrature mixer, and a gate of the third MOS transistor M13 is configured to receive a local oscillator signal. A gate of a third MOS transistor M13 in the first quadrature mixer 31 may be configured to receive a local oscillator signal whose phase is 0°. A gate of a third MOS transistor M13 in the second quadrature mixer 32 may be configured to receive a local oscillator signal whose phase is 90°. A drain of the third MOS transistor M13 in the first quadrature mixer 31 and a drain of the third MOS transistor M13 in the second quadrature mixer 32 are coupled to each other, to be used as the output end of the quadrature frequency-mixing circuit 3.

When the antenna element 11 is configured to receive a differential voltage signal, as shown in FIG. 5, each quadrature mixer in the first quadrature mixer 31 and the second quadrature mixer 32 may include: a seventh MOS transistor M27, an eighth MOS transistor M28, a ninth MOS transistor M29, and a tenth MOS transistor M30. A gate of the seventh MOS transistor M27 and a gate of the tenth MOS transistor each are configured to receive a positive-phase local oscillator signal, and a gate of the eighth MOS transistor M28 and a gate of the ninth MOS transistor M29 each are configured to receive a negative-phase local oscillator signal. A source of the seventh MOS transistor M27 and a source of the eighth MOS transistor M28 are coupled to a sixth node, and a source of the ninth MOS transistor M29 and a source of the tenth MOS transistor M30 are coupled to a seventh node. A drain of the seventh MOS transistor M27 and a drain of the ninth MOS transistor M29 are coupled to an eighth node, and a drain of the eighth MOS transistor M28 and a drain of the tenth MOS transistor M30 are coupled to a ninth node. In addition, a sixth node and a seventh node in the first quadrature mixer 31 are respectively coupled to a sixth node and a seventh node in the second quadrature mixer 32, and the coupled sixth nodes and the coupled seventh nodes are used as differential output ends of the quadrature frequency-mixing circuit 3. A phase of a positive-phase local oscillator signal received by the first quadrature mixer 31 may be 180°, and a phase of a negative-phase local oscillator signal received by the first quadrature mixer 31 may be 0°. A phase of a positive-phase local oscillator signal received by the second quadrature mixer 32 may be 90°, and a phase of a negative-phase local oscillator signal received by the second quadrature mixer 32 may be 270°.

It should be noted that the foregoing MOS transistors in the quadrature mixer may be NMOS transistors, or may be PMOS transistors. In FIG. 4 and FIG. 5, the PMOS transistors are merely used as an example for description. Structures of the quadrature mixers in FIG. 4 and FIG. 5 do not constitute a limitation on this embodiment of this application.

Figure 7:
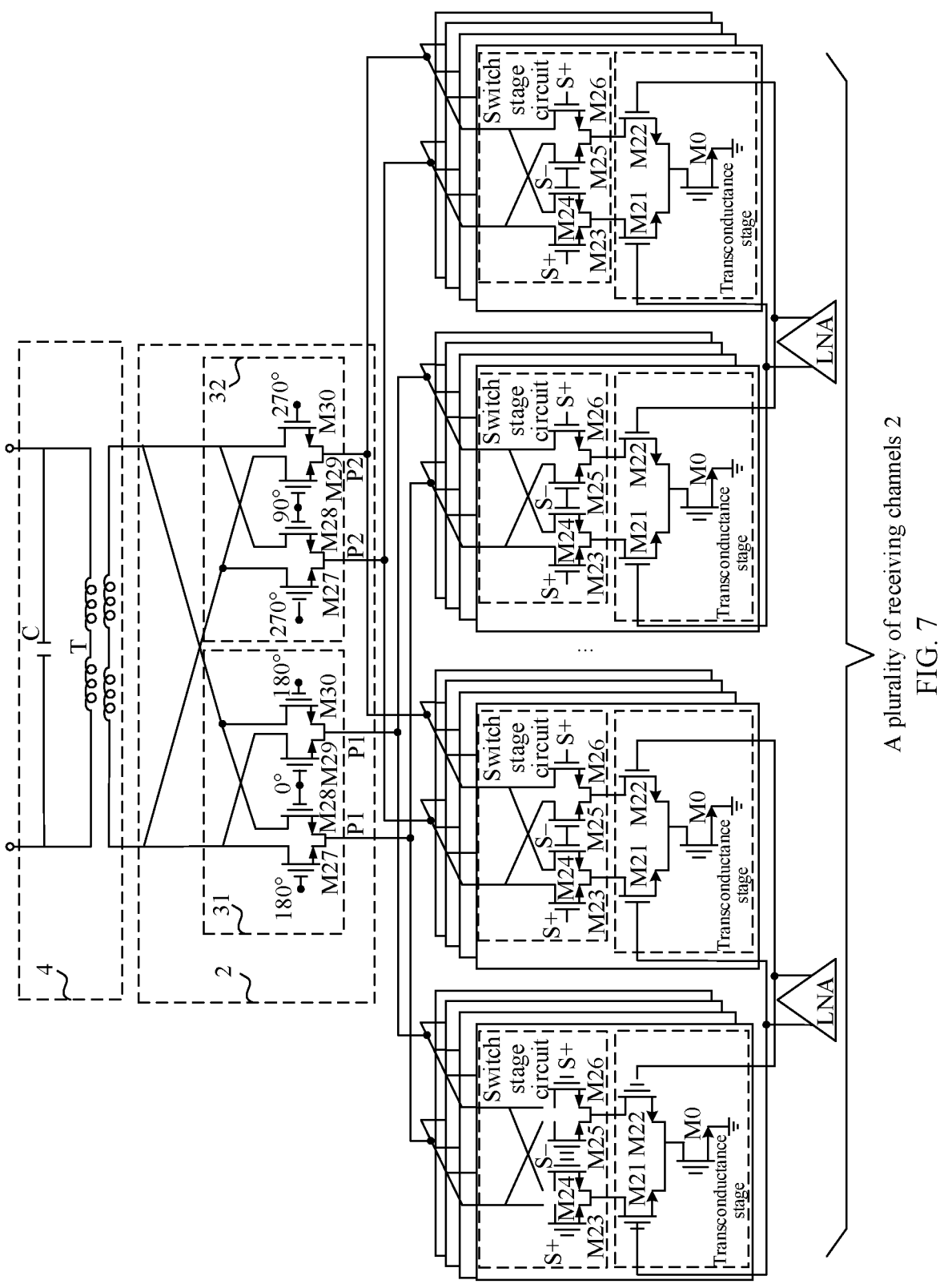
FIG. 7 is a schematic structural diagram of yet another phased array apparatus according to an embodiment of this application.

Further, as shown in FIG. 7, each of the plurality of receiving channels 2 further includes: a low noise amplifier (LNA). An input end of the LNA is coupled to the antenna element 11 corresponding to the receiving channel 2, and an output end of the LNA is separately coupled to the input end of the first transconductance unit array 211 and the input end of the second transconductance unit array 212.

In addition, the signal processing circuit 4 may include: one or more of a transformer T, a capacitor C, a drive amplifier (DA), a low-pass filter (LPF), and an analog-to-digital converter (ADC) coupled to the output end of the quadrature frequency-mixing circuit 3. An example in which the signal processing circuit 4 includes the transformer T and the capacitor C is merely used for description in FIG. 7.

In a phased array apparatus provided in an embodiment of this application, each of a plurality of receiving channels 2 includes a transconductance stage circuit 21. A first transconductance unit array 211 and a second transconductance unit array 212 in the transconductance stage circuit 21 may be configured to convert a voltage signal received by an antenna element 11 into a current signal, and then accumulate current signals of different receiving channels to combine signals in different receiving channels. In addition, the first transconductance unit array 211 and the second transconductance unit array 212 in each of the plurality of receiving channels 2 may be configured to convert one channel of received voltage signals into two channels of current signals. After quadrature frequency mixing processing is implemented on the two channels of current signals by the quadrature frequency-mixing circuit 3, phase shifting of a signal transmitted in the receiving channel 2 may be implemented. Therefore, compared with the conventional technology, in this application, passive phase shifters and power splitting and combining networks do not need to be independently disposed for different receiving channels. Therefore, an area of the phased array is reduced.

In another embodiment of this application, a chip module is further provided. The chip module includes a chip and a package substrate. The chip includes a phased array apparatus, the phased array apparatus may be any phased array apparatus provided above, and the package substrate may include the antenna array provided above.

Figure 8:
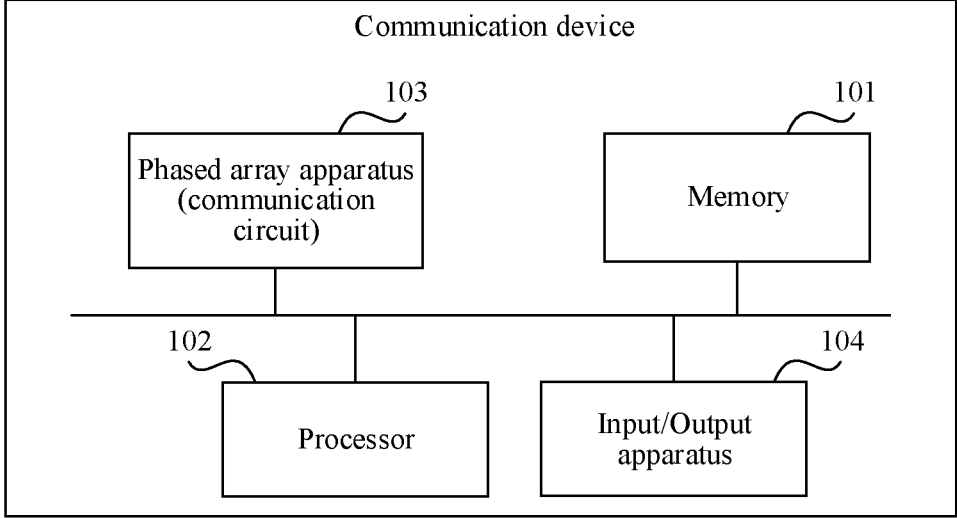
FIG. 8 is a schematic structural diagram of a communication device according to an embodiment of this application.

As shown in FIG. 8, an embodiment of this application further provides a communication device. The communication device includes a memory 101, a processor 102, and the phased array apparatus 103 provided above.

It should be understood that the communication device may be specifically a terminal device such as a smartphone, a computer, or a smartwatch. When the terminal device is a smartphone, the phased array apparatus 103 may alternatively be referred to as a communication circuit, and the terminal device may further include an input/output apparatus 104. The processor 102 is mainly configured to process a communication protocol and communication data, control the entire smartphone, execute a software program, and process data of the software program. The memory 101 is mainly configured to store the software program and data. The phased array apparatus 103 is mainly configured to perform conversion between a baseband signal and a radio frequency signal, process the radio frequency signal, receive and send a radio frequency signal in an electromagnetic wave form, and the like. The input/output apparatus, for example, a touchscreen, a display screen, or a keyboard, is mainly configured to receive data input by a user and output data to the user.

After the smartphone is powered on, the processor 102 may read the software program in the memory 101, interpret and execute instructions of the software program, and process the data of the software program. When data needs to be sent wirelessly, the processor 102 performs baseband processing on the to-be-sent data, and then outputs a baseband signal to the phased array apparatus 103. The phased array apparatus 103 performs radio frequency processing on the baseband signal, and then sends a radio frequency signal in an electromagnetic wave form through an antenna. When data is sent to the smartphone, the phased array apparatus 103 receives a radio frequency signal through the antenna, converts the radio frequency signal into a baseband signal, and outputs the baseband signal to the processor 102. The processor 102 converts the baseband signal into data and processes the data.

A person skilled in the art may understand that for ease of description, FIG. 8 shows only one memory and one processor. In an actual terminal device, there may be a plurality of processors and a plurality of memories. The memory may also be referred to as a storage medium, a storage device, or the like. It should be noted that a type of the memory is not limited in this embodiment of this application.

It should be understood that an $X^{th}$ frequency band mentioned in embodiments of this application, for example, the first frequency band, is a fixed frequency range defined by a standard organization or commercially used, and includes but is not limited to a 5G millimeter-wave frequency band defined by 3GPP in embodiments of this application that includes n257 (26.5 GHz to 29.500 GHz), n260 (37 GHz to 40 GHz), n258 (24.25 GHz to 27.5 GHz), and n261 (27.5 GHz to 28.35 GHz).

Finally, it should be noted that the foregoing descriptions are merely specific implementations of this application, but are not intended to limit the protection scope of this application. Any variation or replacement within the technical scope disclosed in this application shall fall within the protection scope of this application. Therefore, the protection scope of this application shall be subject to the protection scope of the claims.

What is claimed is:

1. A phased array apparatus, wherein the apparatus comprises:

a plurality of receiving channels, coupled to a plurality of antenna elements in an antenna array, wherein each of the plurality of receiving channels comprises a transconductance stage circuit, the transconductance stage circuit comprises a first transconductance unit array and a second transconductance unit array, and an input end of the first transconductance unit array and an input end of the second transconductance unit array in each receiving channel are coupled to an antenna element corresponding to the receiving channel, wherein the first transconductance unit array or the second transconductance unit array comprises a transconductance stage, and the transconductance stage comprises a first metal oxide semiconductor (MOS) transistor and a second MOS transistor, wherein a gate of the first MOS transistor and a gate of the second MOS transistor each is used as an input end of the transconductance stage, a source of the first MOS transistor and a source of the second MOS transistor are coupled to a first node, and a drain of the first MOS transistor and a drain of the second MOS transistor each is used as an output end of the transconductance stage;

a quadrature frequency-mixing circuit, wherein a non-inverting input end and a quadrature input end of the quadrature frequency-mixing circuit are respectively coupled to an output end of the first transconductance unit array in the plurality of receiving channels and an output end of the second transconductance unit array in the plurality of receiving channels; and a signal processing circuit, wherein an input end of the signal processing circuit is coupled to an output end of the quadrature frequency-mixing circuit.

2. The apparatus according to claim 1, wherein the first transconductance unit array and the second transconductance unit array in each of the plurality of receiving channels have a phase shift function.

3. The apparatus according to claim 1, wherein the first transconductance unit array and the second transconductance unit array each comprises a plurality of transconductance stages, and a quantity of conducted transconductance stages in the plurality of transconductance stages is adjustable.

4. The apparatus according to claim 1, wherein the first transconductance unit array and the second transconductance unit array each is provided with a first control circuit and a second control circuit, the first control circuit is configured to control a quantity of conducted or disconnected transconductance stages in the first transconductance unit array, and the second control circuit is configured to control a quantity of conducted or disconnected transconductance stages in the second transconductance unit array.

5. The apparatus according to claim 4, wherein each control circuit in the first control circuit and the second control circuit comprises a switch stage circuit coupled to a transconductance stage in a one-to-one correspondence, and the switch stage circuit is configured to control conduction or disconnection of the corresponding transconductance stage.

6. The apparatus according to claim 5, wherein the switch stage circuit is provided with a first signal generator and a second signal generator, and the first signal generator and the second signal generator are respectively configured to generate a switch signal for conducting the switch stage circuit and a switch signal for disconnecting the switch stage circuit.

7. The apparatus according to claim 5, wherein the switch stage circuit comprises a third MOS transistor, a fourth MOS transistor, a fifth MOS transistor, and a sixth MOS transistor, wherein:

a gate of the third MOS transistor and a gate of the sixth MOS transistor each is configured to receive a positive-phase switch signal, and a gate of the fourth MOS transistor and a gate of the fifth MOS transistor each is configured to receive a negative-phase switch signal;

a source of the third MOS transistor and a source of the fourth MOS transistor each is coupled to a second node, a source of the fifth MOS transistor and a source of the sixth MOS transistor each is coupled to a third node, and the second node and the third node each is an input end of the switch stage circuit; and a drain of the third MOS transistor and a drain of the fifth MOS transistor each is coupled to a fourth node, a drain of the fourth MOS transistor and a drain of the sixth MOS transistor each is coupled to a fifth node, and the fourth node and the fifth node each is an output end of the switch stage circuit.

8. The apparatus according to claim 1, wherein the transconductance stage further comprises a tail current transistor coupled between the first node and a grounding end.

9. The apparatus according to claim 1, wherein the quadrature frequency-mixing circuit comprises a first quadrature mixer having a first non-inverting input end and a first quadrature input end, a second quadrature mixer having a second non-inverting input end and a second quadrature input end, and a local oscillator signal generator having a non-inverting output end and a quadrature output end, wherein:

the first non-inverting input end, as the non-inverting input end of the quadrature frequency-mixing circuit, is coupled to the output end of the first transconductance unit array in the plurality of receiving channels;

the second quadrature input end, as the quadrature input end of the quadrature frequency-mixing circuit, is coupled to the output end of the second transconductance unit array in the plurality of receiving channels;

the first quadrature input end is coupled to the quadrature output end of the local oscillator signal generator; and the second non-inverting input end is coupled to the non-inverting output end of the local oscillator signal generator.

10. The apparatus according to claim 9, wherein each quadrature mixer in the first quadrature mixer and the second quadrature mixer comprises a seventh MOS transistor, an eighth MOS transistor, a ninth MOS transistor, and a tenth MOS transistor, wherein:

a gate of the seventh MOS transistor and a gate of the tenth MOS transistor each is configured to receive a positive-phase local oscillator signal, and a gate of the eighth MOS transistor and a gate of the ninth MOS transistor each is configured to receive a negative-phase local oscillator signal;

a source of the seventh MOS transistor and a source of the eighth MOS transistor are coupled to a sixth node, and a source of the ninth MOS transistor and a source of the tenth MOS transistor are coupled to a seventh node;

a drain of the seventh MOS transistor and a drain of the ninth MOS transistor are coupled to an eighth node, and a drain of the eighth MOS transistor and a drain of the tenth MOS transistor are coupled to a ninth node;

the sixth node and the seventh node in the first quadrature mixer are respectively coupled to the sixth node and the seventh node in the second quadrature mixer, to serve as output ends of the quadrature frequency-mixing circuit; and when the quadrature mixer is the first quadrature mixer, the sixth node and the seventh node each is used as the first non-inverting input end; and when the quadrature mixer is the second quadrature mixer, the sixth node and the seventh node each is used as the second quadrature input end.

11. The apparatus according to claim 1, wherein each of the plurality of receiving channels further comprises:

a low noise amplifier, wherein an input end of the low noise amplifier is coupled to the antenna element corresponding to the receiving channel, and an output end of the low noise amplifier is separately coupled to the input end of the first transconductance unit array and the input end of the second transconductance unit array.

12. The apparatus according to claim 1, wherein the signal processing circuit comprises:

one or more of a transformer, a capacitor, a drive amplifier, a low-pass filter, or an analog-to-digital converter coupled to the output end of the quadrature frequency-mixing circuit.

13. A chip module, comprising a chip and a package substrate, wherein the chip is fastened to the package substrate, the chip comprises a phased array apparatus, and the package substrate comprises an antenna array having a plurality of antenna elements, and wherein the phased array apparatus comprises:

a plurality of receiving channels, coupled to a plurality of antenna elements in an antenna array, wherein each of the plurality of receiving channels comprises a transconductance stage circuit, the transconductance stage circuit comprises a first transconductance unit array and a second transconductance unit array, and an input end of the first transconductance unit array and an input end of the second transconductance unit array in each receiving channel are coupled to an antenna element corresponding to the receiving channel, wherein the first transconductance unit array or the second transconductance unit array comprises a transconductance stage, and the transconductance stage comprises a first metal oxide semiconductor (MOS) transistor and a second MOS transistor, wherein a gate of the first MOS transistor and a gate of the second MOS transistor each is used as an input end of the transconductance stage, a source of the first MOS transistor and a source of the second MOS transistor are coupled to a first node, and a drain of the first MOS transistor and a drain of the second MOS transistor each is used as an output end of the transconductance stage;

a quadrature frequency-mixing circuit, wherein a non-inverting input end and a quadrature input end of the quadrature frequency-mixing circuit are respectively coupled to an output end of the first transconductance unit array in the plurality of receiving channels and an output end of the second transconductance unit array in the plurality of receiving channels; and a signal processing circuit, wherein an input end of the signal processing circuit is coupled to an output end of the quadrature frequency-mixing circuit.

14. The chip module according to claim 13, wherein the first transconductance unit array and the second transconductance unit array in each of the plurality of receiving channels have a phase shift function.

15. The chip module according to claim 13, wherein the first transconductance unit array and the second transconductance unit array each comprises a plurality of transconductance stages, and a quantity of conducted transconductance stages in the plurality of transconductance stages is adjustable.

16. A communication device, wherein the communication device comprises a phased array apparatus, and wherein the apparatus comprises:

a plurality of receiving channels, coupled to a plurality of antenna elements in an antenna array, wherein each of the plurality of receiving channels comprises a transconductance stage circuit, the transconductance stage circuit comprises a first transconductance unit array and a second transconductance unit array, and an input end of the first transconductance unit array and an input end of the second transconductance unit array in each receiving channel are coupled to an antenna element corresponding to the receiving channel, wherein the first transconductance unit array or the second transconductance unit array comprises a transconductance stage, and the transconductance stage comprises a first metal oxide semiconductor (MOS) transistor and a second MOS transistor, wherein a gate of the first MOS transistor and a gate of the second MOS transistor each is used as an input end of the transconductance stage, a source of the first MOS transistor and a source of the second MOS transistor are coupled to a first node, and a drain of the first MOS transistor and a drain of the second MOS transistor each is used as an output end of the transconductance stage;

a quadrature frequency-mixing circuit, wherein a non-inverting input end and a quadrature input end of the quadrature frequency-mixing circuit are respectively coupled to an output end of the first transconductance unit array in the plurality of receiving channels and an output end of the second transconductance unit array in the plurality of receiving channels; and a signal processing circuit, wherein an input end of the signal processing circuit is coupled to an output end of the quadrature frequency-mixing circuit.

17. The communication device according to claim 16, wherein the first transconductance unit array and the second transconductance unit array in each of the plurality of receiving channels have a phase shift function.

18. The communication device according to claim 16, wherein the first transconductance unit array and the second transconductance unit array each comprises a plurality of transconductance stages, and a quantity of conducted transconductance stages in the plurality of transconductance stages is adjustable.

* * * * *